United States Patent [19]

Fleischer

[11] Patent Number: 4,703,197

[45] Date of Patent: Oct. 27, 1987

[54] PHASE-CONTROLLED POWER SWITCHING CIRCUIT

[75] Inventor: Kenneth H. Fleischer, Los Angeles, Calif.

[73] Assignee: International Rectifier Corporation, Los Angeles, Calif.

[21] Appl. No.: 867,533

[22] Filed: May 28, 1986

[51] Int. Cl.⁴ ............................................. H03K 17/72
[52] U.S. Cl. .................................... 307/646; 307/592; 307/597; 307/643; 323/243
[58] Field of Search ........... 307/252 N, 252 T, 252 B, 307/252 UA, 592, 597, 601, 296 A; 323/242, 243, 321, 235, 239; 363/27, 128, 135

[56] References Cited

U.S. PATENT DOCUMENTS

| | | | |
|---|---|---|---|
| 3,588,598 | 6/1971 | Isaacs | 307/252 T |
| 3,610,961 | 10/1971 | Hewlett, Jr. | 307/252 T |
| 3,633,094 | 1/1972 | Clements | 307/252 UA |
| 3,821,634 | 6/1974 | Sabolic | 323/24 |
| 3,859,591 | 1/1975 | Saunders | 307/252 UA |
| 4,296,312 | 10/1981 | Salem | 307/252 UA |

Primary Examiner—John Zazworsky
Attorney, Agent, or Firm—Ostrolenk, Faber, Gerb & Soffen

[57] ABSTRACT

The application of a controlled amount of alternating current (AC) power to an electrical load is achieved in a power switching circuit utilizing phase-control. In the switching circuit, a first analog signal is generated and repeats in every half-cycle of the AC power voltage waveform. A second analog signal is generated and is changeable in value either in a predetermined manner, or in response to the control input signal. The second signal is not synchronized with the half-cycles of the power source. A comparator detects when the first signal intersects the second signal in value and thereupon initiates gating of a switching device, such as a silicon-controlled rectifier.

32 Claims, 12 Drawing Figures

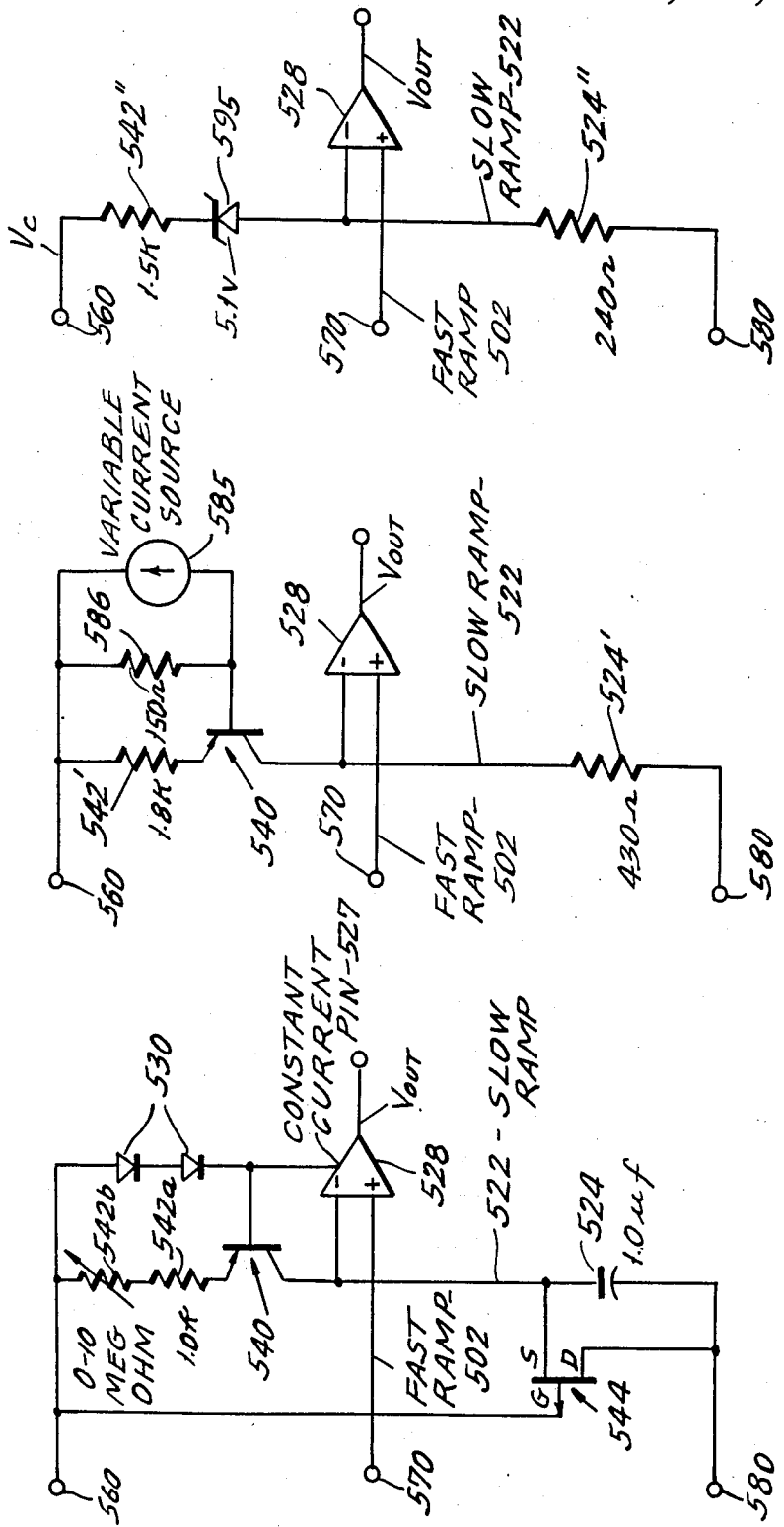

PHASE-CONTROLLED POWER SWITCHING CIRCUIT

BACKGROUND OF THE INVENTION

The present invention relates to a phase-controlled power switching circuit wherein power from an alternating current (AC) source may be applied to an electrical load in a controllable manner. The invention more particularly relates to a power switching circuit in which power level control is achieved through switching techniques involving phase-control.

Various types of electrical devices are subject to damage upon abrupt application of power to the devices. Such abrupt powering of a load may induce a high inrush or surge current in the load that may create a physical disturbance in the load. For example, the surge current in an incandescent lamp, which is large due to low initial filament resistance, may reduce filament life by causing a mechanical shock to the filament. Such shock arises due to interaction between the ambient magnetic field and the magnetic field generated by the filament current.

Prior art phase-control systems include circuits employing unijunction transistors, vacuum tubes, or thyratrons. Such circuits have proven capable of supplying power to a load in a controlled manner and have reduced or eliminated surge problems. However, these circuits tended to be complex or physically cumbersome, especially the tube circuits.

Prior art phase-control systems using microprocessors are capable of achieving a desired, gradual rise in power supplied to an electrical load. The problem with using a microprocessor is that such a device is costly. A microprocessor is typically much more sophisticated than is required for phase control purposes. Accordingly, the full capabilities of a microprocessor are underutilized and represent a partially wasted expense.

Accordingly, it would be desirable to provide a phase-control power switching circuit that avoids the unnecessary expense of a microprocessor-based system.

SUMMARY OF THE INVENTION

An object of the present invention is to provide a phase-controlled power switching circuit capable of eliminating surge currents upon initial powering of an electrical load.

A further object of the invention is to provide a phase-control power switching circuit in which analog circuitry is used to implement phase-control of a switching device.

Another object is to provide a circuit design for a phase-controlled power switching circuit that may comprise a basic "building block" which may be readily and inexpensively modified to provide a variety of phase controlled powering functions, such as user-controlled power levels.

The foregoing and further objects of the invention are attained in a phase-controlled power switching circuit. The circuit includes, in a preferred form, a pair of back-to-back connected SCRs that are serially connected between an electrical power source and an electrical load. Alternatively, a triac could be used. A means is provided for generating a first analog signal that changes from an initial value at a zero crossing of the power source towards a final value that cannot be reached in a half-cycle of the power source. A means is provided for resetting the first analog signal to the initial value. Such resetting occurs within a half-cycle of the power source.

A further means is provided for generating a second analog signal that is changeable in value in a range sufficiently large to include the initial and final values of the first signal.

A comparator means responsive to the first and second signals is provided for detecting the occurrence of these signals becoming equal in value to each other. A gate drive means responsive to the comparator means is provided for gating into conduction a respective one of the SCRs at each successive instant when the first and second signals become equal in value to each other.

In a preferred implementation of the present power switching circuit, the first signal generating means comprises a capacitor connected to a node on which the first signal voltage is present, a voltage-limiting circuit connected across the capacitor to limit the maximum value across the capacitor, and a resistor connected across the capacitor to provide a path through which the capacitor can discharge. Additionally provided is a means for charging the capacitor to its maximum value whenever zero voltage is detected across the SCRs, which happens at least at every zero voltage crossing of the AC power source.

In a preferred implementation of the second signal generating means, a capacitor is connected to a node on which the second signal voltage is present. A constant current source is connected to this node for supplying the capacitor with constant current. The capacitor accordingly charges in a linear fashion so that the second signal constitutes a ramp voltage of increasing value. The second signal is not phase-related and increases towards a maximum value over many half-cycles of the power source.

With the first and second signal generating means implemented in the foregoing manner, the first signal decreases rapidly in each half-cycle, while the second signal increases slowly as a ramp signal. The comparator means detects when the first signal decreases to the value of the second signal. This occurs earlier and earlier in each half-cycle of the power source. The SCRs are gated on whenever the comparator means detects the foregoing equivalency condition, and, as a result, the electrical load is supplied with power from the AC source starting earlier and earlier in each half-cycle. Accordingly, power to the load is supplied in a gradually increasing fashion.

The foregoing phase-controlled power switching circuit can be readily and inexpensively modified by altering only the second signal generating means. For example, rather than providing means to generate a constantly increasing ramp signal, means oan be provided to vary the second signal at the discretion of an operator. Exemplary circuits for providing such a user-selectable second signal are described hereinafter.

The present phase-controlled power switching circuit can be implemented without a microprocessor or associated software. The phase-control portion of the circuit, instead, incorporates analog circuit elements, to reduce circuit cost and may be made even more economical by integrating the analog elements together in one or more integrated circuits.

BRIEF DESCRIPTION OF THE DRAWINGS

These objects as well as other objects of this invention shall become readily apparent after reading the following description of the accompanying drawings in which:

FIGS. 6, 7 and 8 illustrate respective modifications to the circuit of FIG. 2 which provide for various types of user control over the powering of the electrical load of FIG. 1.

DETAILED DESCRIPTION OF THE PREFERRED EMBODIMENTS

Figure 1:
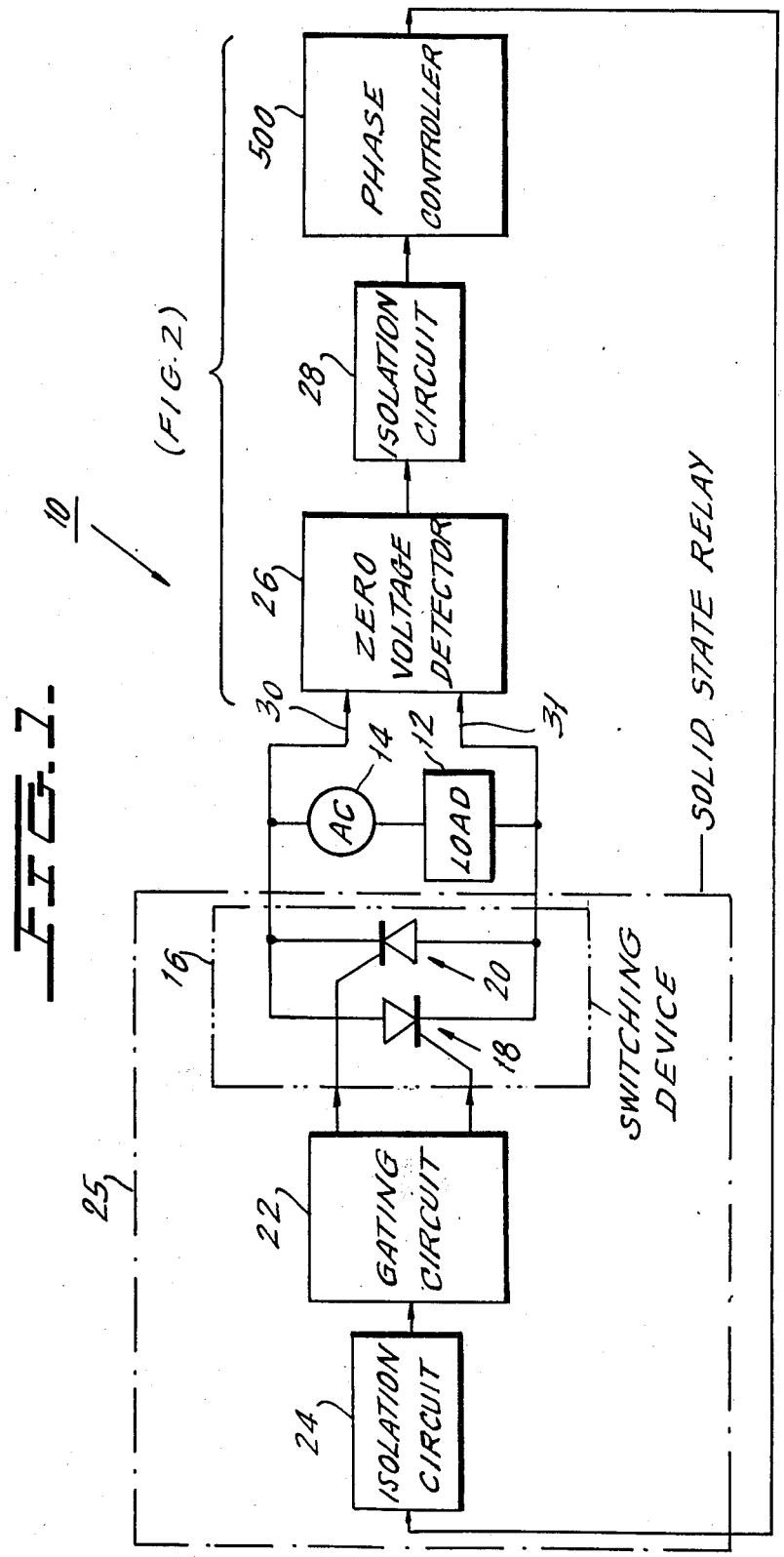
FIG. 1 is a schematic diagram, partially in block form, of a phase-controlled power switching circuit that may incorporate features of the present invention.

FIG. 1 illustrates, in general form, a phase-controlled power switching circuit 10, which may incorporate features of the present invention. In circuit 10, a load 12 is serially connected to an alternating current (AC) power source 14. The load 12 comprises an electrical apparatus such as an electrical transformer or an incandescent lamp. Connected across the load 12 and the AC power source 14 is a switching device 16 that is operative to selectively place the load 12 and the power source 14 in a closed circuit relationship in which the load is powered by the power source.

The switching device 16 preferably comprises a pair of silicon-controlled rectifiers (SCRs) 18 and 20. The SCRs are connected in a so-called "back-to-back" fashion, such that the anode of one is connected to the cathode of the other, and vise-versa. The back-to-back arrangement of the SCRs 18 and 20 permits conduction through the load 12 of current flowing in either direction. Device 16 could also be a triac.

Figure 3A:
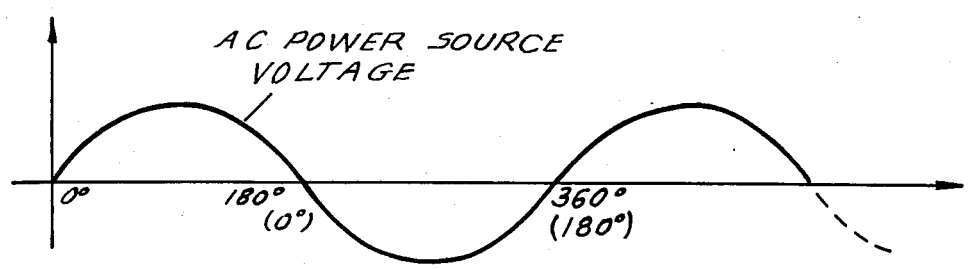
FIGS. 3A-3D 4, 5A and 5B are voltage waveforms taken at various locations in the power switching circuit shown in FIGS. 1 and 2.

The SCRs 18 and 20 are triggered into conduction by control signals applied to their respective gates. The control signals are generated by a gating circuit 22. SCR 18 is gated into conduction on a positive-going voltage of AC power source 14; that is, between a 0° and 180° phase angle of the voltage waveform across the source 14, which is shown in FIG. 3A. Due to its nature, the SCR 18 does not conduct during the negative-going voltage of the power source 14. The SCR 20 is gated into conduction during the negative-going voltage of the source 14. The SCR 20 does not conduct during the positive-going voltage of the source 14.

Depending upon the respective phase locations of the applied AC voltage when the SCRs 18 and 20 are switched on, the amount of AC power supplied to the load 12 by AC source 14 can be varied from zero to full power of the source 14.

The power supplied to the load 12 by the source 14 can be conditioned in various ways through design and operation of a phase controller 500. The output of such phase controller 500 is applied to the gating circuit 22 via an isolation circuit 24. The gating circuit 22 may comprise a conventional circuit used to achieve dependable gating of the SCRs 18 and 20. The isolation circuit 24, which may comprise a conventional optical isolation link, for example, electrically isolates the gating circuit 22 from the phase controller 500. Devices 16, 22 and 24 may be implemented by a conventional solid state relay of the type not incorporating zero cross detection circuitry (i.e., one known as having "random turn on"). A suitable relay, by way of example, is a relay designated "D2440-10", sold by the Crydom Solid State Products Division of International Rectifier Corporation, located in El Segundo, Calif.

To provide phase information to the phase controller 500, a zero voltage detector 26 detects the occurrence of zero voltage across the SCRs 18 and 20, and provides this information to the phase controller 500, via an electrical isolation circuit 28.

The zero voltage detector 26, isolation circuit 28, and phase controller 500 are discussed in further detail in connection with FIG. 2.

Figure 2:
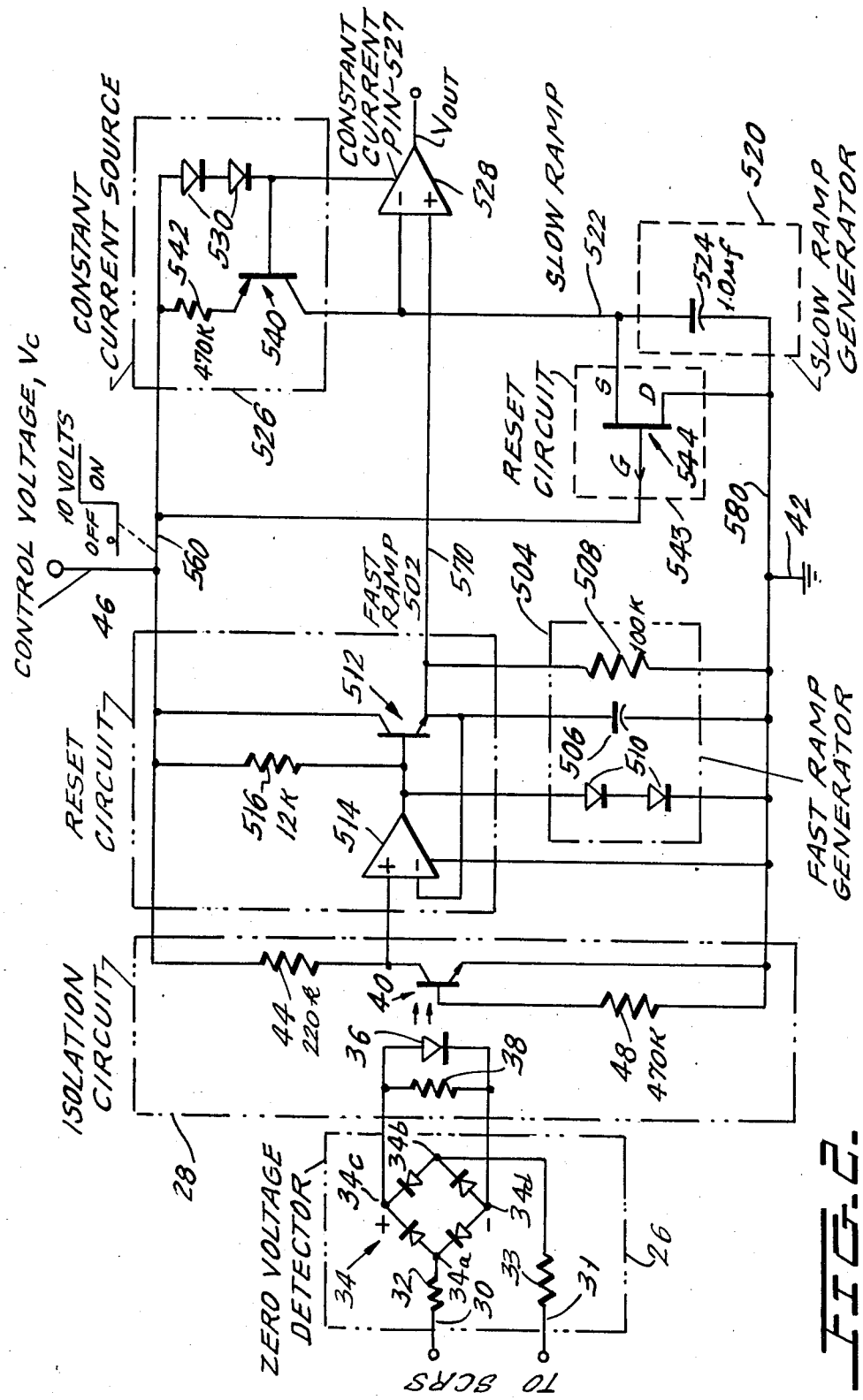
FIG. 2 is a schematic diagram of a circuit that may be used to implement various parts of the switching circuit of FIG. 1.

Referring to FIG. 2, a circuit diagram for an exemplary zero voltage detector 26 is shown. The detector 26 includes input leads 30 and 31 that are connected across the SCRs 18 and 20 of FIG. 1. Signals on input terminals 30 and 31 are passed, via respective current-limiting resistors 32 and 33, to the AC input terminals 34a and 34b of a diode-type bridge rectifier 34. The AC terminals 34a and 34b may be interchanged with each other due to the symmetry of the bridge rectifier 34. The direct current (DC) output terminals 34c and 34d of the rectifier 34 are connected across a light emitting diode 36 of isolation circuit 28. A resistor 38 is also connected across the light emitting diode 36 to insure turn off of the diode when current from the bridge rectifier is terminated.

Figure 3B:
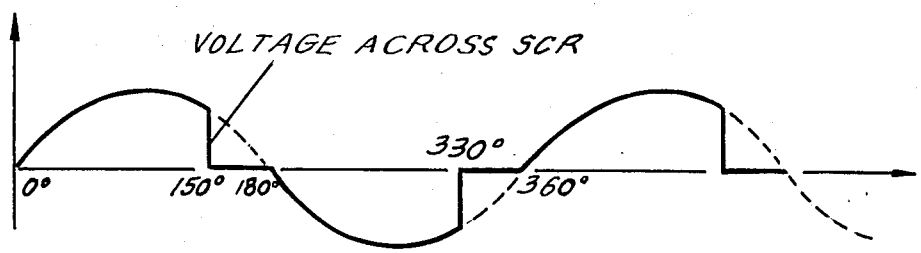

The bridge rectifier 34 supplies current to the light emitting diode 36 whenever the voltage across its input terminals 30 and 31 is greater than some relatively small value of typically several volts, which defines a zero cross "window". This occurs when the SCRs 18 and 20, shown in FIG. 1, are both off and when the AC power source 14 is not at a zero crossing. With reference to FIG. 3B, this occurs in the phase range from 0° to 150°, by way of example, and from 180° to 330°, when both SCRs 18 and 20 are arbitrarily assumed off. In the phase range between 150° and 180°, however, SCR 18 is arbitrarily assumed on such that zero voltage or a voltage within the zero cross "window" exists across the SCRs and, hence, across input terminals 30 and 31 of the zero voltage detector 26. Similarly, in the phase range between 330° and 360°, SCR 20 is arbitrarily assumed on and zero voltage or a voltage within the zero cross "window" exists across detector terminals 30 and 31. The switching points in FIG. 3B are arbitrary and may vary from the illustrated positions, but serve to help explain operation of the circuit of FIG. 2.

With light emitting diode 36 of FIG. 2 supplied with current, a photoactivated transistor 40, such as an NPN bipolar transistor, is driven into saturation. The collector of the transistor 40 is thus forced to a voltage close to the voltage on reference node 42. Collector current for the transistor 40 is supplied through a resistor 44 which receives current through a terminal 46 on which a control voltage, $V_c$, is impressed. The collector of the transistor 40 provides the output of isolation circuit 28.

Figure 3C:
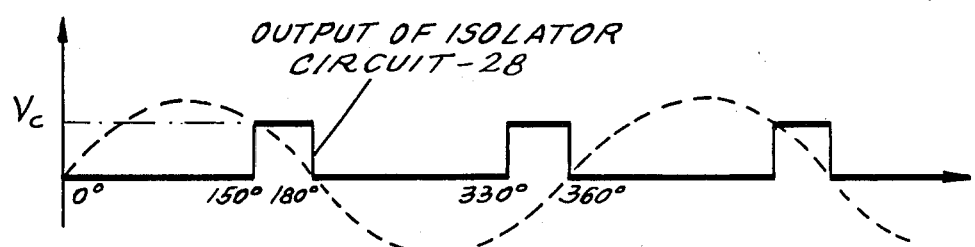

The voltage on the output of isolation circuit 28 is shown in FIG. 3C as being near zero in the phase range from 0° to 150°. At 150°, the SCR 18 is assumed to turn on, the voltage across terminals 30 and 31 drops to near zero, and the bridge rectifier 34 ceases supply of current to the light emitting diode 36.

When the light emitting diode 36 turns off, the photoactivated transistor 40 loses its optical base drive. A resistor 48, connected across the base and emitter of the transistor, assures rapid turn off of transistor 40. The collector of the transistor 40 thereupon rises to the potential of the control voltage $V_c$.

In FIG. 3C, the voltage on the collector of transistor 40, which constitutes the output of isolation circuit 28, is shown as remaining at the voltage $V_c$ in the phase range from 150° to 180°. At 180°, the SCR 18 turns off and both SCRs 18 and 20 remain off until the 330° phase position.

From the foregoing, it will be appreciated that the zero voltage detector 26, via the isolation circuit 28, provides phase information on the collector of transistor 40. In FIG. 2, the entire portion of the circuit to the right of the collector of transistor 40 comprises a preferred implementation of the phase controller 500 of FIG. 1. This is denoted by the use of reference numerals between 500 and 599 for parts of the phase controller 500.

Figure 3D:
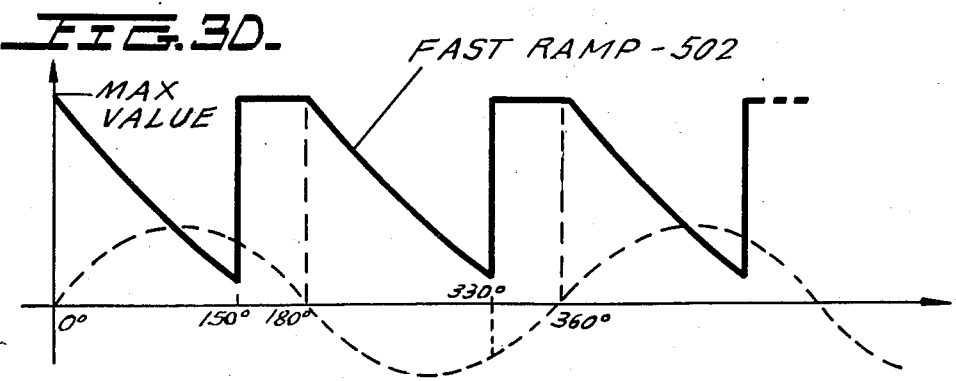

Considering now the details of the phase controller 500 as illustrated in FIG. 2, a fast ramp signal at 502 is produced by a fast ramp generator 504. The fast ramp signal is shown in FIG. 3D. Specifically, the fast ramp signal is the voltage on a capacitor 506, which is allowed to discharge through a resistor 508. An NPN transistor 512 charges capacitor 506, and hence the fast ramp signal at 502, to a maximum value, described below. Transistor 512 is in an on state so long as the output of a voltage comparator 514 is at its "high" value, typically at 1.2 volts, whereas the "low" output of the voltage comparator 514 is typically at less than 0.4 volts. The voltage comparator 514 is at its highest output so long as the output of the isolation circuit 28 is at the control voltage $V_c$. Thus, the fast ramp signal at 502 is maintained at a maximum value so long as the output of the isolator circuit 28 is at the control voltage $V_c$. This can be better appreciated from a comparison of FIGS. 3C and 3D, which are self-explanatory.

The maximum value of the fast ramp signal at 502 is set when the output of the voltage comparator 514 is "high". When this occurs, the maximum value of a fast ramp signal at 502 is determined by the voltage drop across a pair of diodes 510 and the base-to-emitter voltage drop of the transistor 512.

Voltage comparators 514 and 528 are suitably two halves of the same integrated circuit. A suitable integrated circuit is a device designated in the art as an "LM2903N". In the foregoing device, the outputs of each half are configured as open-collector NPN transistors. For each half of the device, the base of such NPN transistor is controlled internally and the emitter is connected to the IC's negative-supply pin.

Resistor 516 provides base current for transistor 512. This base current is shunted off by comparator 514 when its output is in a "low" state.

When the output of the isolation circuit 28 is in its "low" state (that is to say, phototransistor 40 is saturated), the transistor 512 turns off in response to the output of the voltage comparator 514 going "low", The capacitor 506 then proceeds to discharge through the resistor 508 until it is recharged by virtue of the output of the isolation circuit 28 switching to the control voltage $V_c$. This resetting action of the fast ramp signal at 502 occurs at each zero crossing of the AC power source 14, or when one of the SCRs 18 or 20 is on. Thus, in FIG. 3D, the fast ramp signal at 502 decays in value between 0° and 150°, but is reset at 150° to its maximum value because the SCR 18 has been turned on (see FIG. 3B).

As used herein, a "ramp" signal means an approximately linear signal. The fast ramp signal decays according to an RC time constant that is approximately, but not precisely, linear in waveform.

Figure 4:
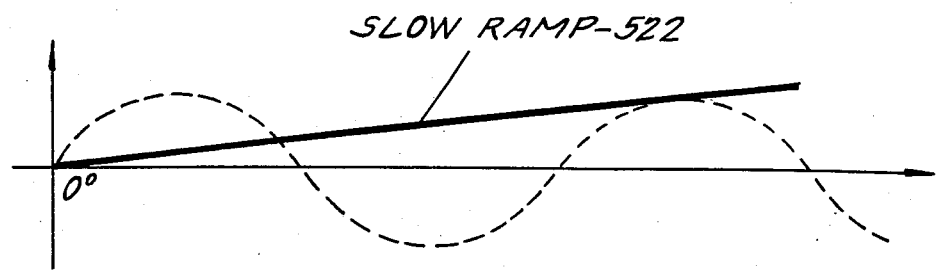

To interact with the fast ramp signal at 502, a slow ramp signal at 522, depicted in FIG. 4, is generated by a slow ramp generator 520. Specifically, a capacitor 524 is supplied with current from a constant current source 526. Thus, the slow ramp signal 522 increases in a linear fashion.

The constant current source 526 is preferably implemented by using the positive supply current supplied to the voltage comparator 528, through pin 527. The current supplied to pin 527 comprises biasing current for the base of transistor 540 and its base voltage reference. By way of example, the voltage comparator 528 may be one-half of a device designated in the art as "LM2903N". The voltage comparator 514 may be the other half of the same device. The current drawn by pin 527 tends to be constant, and it thus creates a constant voltage drop across the pair of serially-connected diodes 530, which provides a base voltage reference for transistor 540. The voltage across a resistor 542 is rendered constant by the constant voltage drops across the diodes 530 and the base-to-emitter junction of the transistor 540. Accordingly, constant current is supplied to the capacitor 524 by the transistor 540.

A reset circuit 543 resets the slow ramp signal at 522 to the potential of reference node 42 when the control voltage $V_c$ is switched to zero. The reset circuit 543 includes a p-channel junction field-effect transistor (JFET) 544 that is biased off whenever the control voltage $V_c$ is at its high value, which is typically between 3.5 and 10 volts. When the control voltage $V_c$ drops below about 3.1 volts, the (JFET) 544 turns on and quickly discharges the capacitor 524.

The fast ramp signal at 502 is compared with the slow ramp signal at 522 by the voltage comparator 528. The voltage comparator 528 produces a "high" output as long as the fast ramp signal exceeds the slow ramp signal in value, but produces a "low" output when the slow ramp signal exceeds the fast ramp signal. These "high" and "low" outputs are suitably the same as for voltage comparator 514 as set forth above.

Figure 5A:
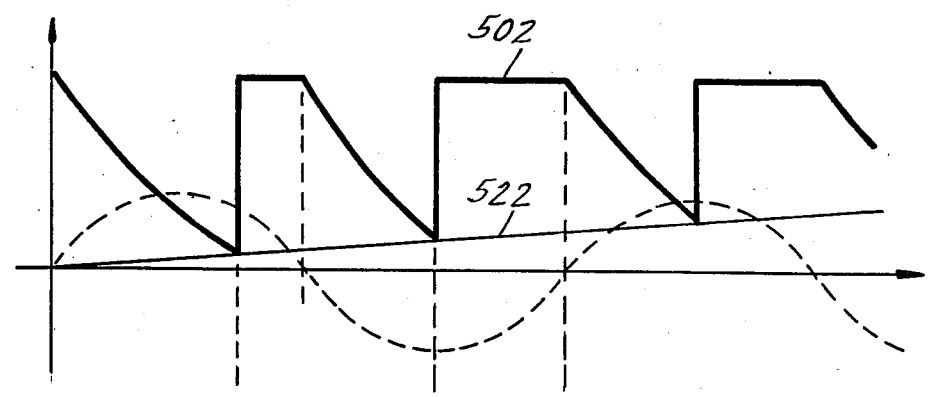
Figure 5B:
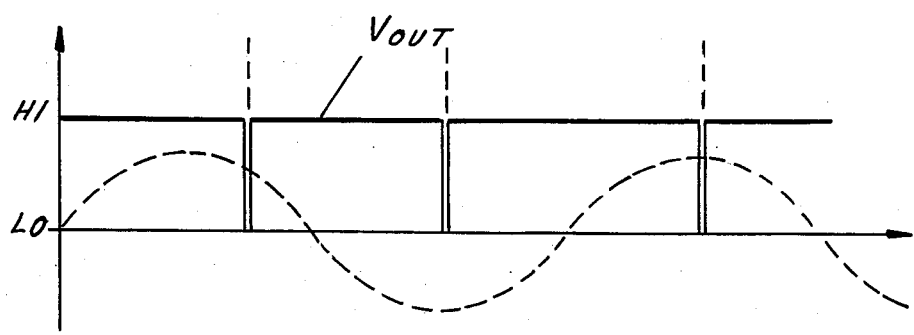

FIG. 5A illustrates the interaction between the fast ramp signal at 502 and the slow ramp signal at 522. As the slow ramp signal at 522 increases in value, the fast ramp at signal 502 falls to the value of the slow ramp signal at 522 earlier and earlier in each succeeding half-cycle of the AC power source 14. The output voltage $V_{out}$ of the voltage comparator 528 can be seen in FIG. 5B to momentarily assume a low value whenever the fast ramp voltage falls below the slow ramp voltage.

Whenever the output voltage $V_{out}$ assumes a low value, the appropriate SCR 18 or 20 is gated into conduction by the gating circuit 22 of FIG. 1. Thereupon, the voltage across the SCRs 18 and 22 drops to zero (FIG. 3B), the output of the isolator circuit 28 is brought to the control voltage $V_c$ potential (FIG. 3C), and the fast ramp signal at 502 is reset to its maximum value (FIG. 3D).

The use of the interacting fast and slow ramp signals at 502 and 522, respectively, results in triggering of the SCRs 18 and 22 earlier and earlier in each half-cycle. Through appropriate selection of circuit parameters, the SCRs 18 and 22 can be triggered gradually earlier and earlier in each half-cycle. In this manner, the AC power supplied to the load 12 can be gradually increased from a first value, typically zero power, to a final value, typically full power. The load 12 may thus be gradually energized.

To review the description so far, the ability to gradually energize a load is implemented in the circuit of FIG. 2 by the generation of a fast ramp signal that is synchronized to the half-cycles of the AC power source, and by the generation of a slow ramp signal that constantly changes in value preferably in opposition to the fast ramp signal. The circuit of FIG. 2 can be implemented with readily-available analog circuit elements so as to avoid the complexities of microprocessor-based circuits.

The circuit of FIG. 2 can be readily modified in regard to the generation of the slow ramp signal at 522. For example, the circuit of FIG. 2 to the right of nodes 560, 570 and 580 can be replaced by the modified circuit of FIG. 6. The single resistor 542 (FIG. 2) can be replaced by a fixed resistor 542a and a variable resistor 542b. Adjustment of the variable resistor 542b provides control over the rate of rise of the slow ramp signal at 522. The rate of turn-on of the electrical load 12 can thus be readily varied with the circuit of FIG. 6.

FIG. 7 illustrates a further modification of the circuit of FIG. 2 to the right of nodes 560, 570 and 580. In the circuit of FIG. 7, selection of the current level in a variable current source 585 determines the level of the slow ramp signal at 522, and hence the amount of power applied to the load 12. The variable current source can be adjusted in an arbitrary manner as desired to produce a desired slow ramp signal at 522.

In the modified circuit of FIG. 7, the slow ramp capacitor 524 (FIG. 2) has been replaced by a resistor 524'. The current directed through the resistor 524', via transistor 540, is controlled by a variable current source 585. Thus, assuming the base current of the transistor 540 is negligible, only current from the source 585 flows through a resistor 586. The voltage drop across the resistor 586 is thus determined by the level of current provided by the current source 585. Thus, with the transistor 540 on, the voltage impressed across the resistor 542' can be determined, assuming a constant base-to-emitter voltage drop for the transistor 540. With the voltage across the resistor 542' known, the current provided to the resistor 524', via the transistor 540, can be determined. Thus, the slow ramp signal at 522 can be seen to depend upon the current level in the variable current source 585.

By varying the level of the variable current source 585 from 4 to 20 milliamps, the amount of AC power provided to the load 12 is varied from virtually none to virtually full power, subject to the following conditions. The values for resistors 524', 542' and 586 are as illustrated in FIG. 7, and the node 560 is at least 3.4 volts higher in DC potential than node 580. The selection of different circuit parameters to achieve different results will be apparent to those skilled in the art.

FIG. 8 illustrates a still further modification of the circuit to the right of nodes 560, 570 and 580 in FIG. 2. In the circuit of FIG. 8, selection of the control voltage level $V_c$ determines the level of the slow ramp signal at 522, and hence the amount of power applied to the load 12.

In the circuit of FIG. 8, current through a resistor 524" determines the slow ramp signal at 522 by determining the voltage drop across the resistor. A Zener diode 595 and a further resistor 542" are serially connected between the resistor 524" and the node 560. Current in resistor 524" is determined by the control voltage $V_c$ on node 560. However, no current flows through the resistor 524" until the control voltage $V_c$ exceeds the voltage rating of the Zener diode 595. A further increase in the control voltage $V_c$ is operative to proportionately increase the voltage drop across the resistor 524". With the resistors 524' and 542" and the Zener diode 595 having the respective values indicated in FIG. 6, the control voltage $V_c$ may be varied as follows to achieve different levels of powering of the load 12. Adjustment of $V_c$ from 0 to 5.1 volts: no power to the load; adjustment of $V_c$ from 5.1 to 10 volts: load power variation from zero to full to power; and increase of $V_c$ above 10 volts: the load remains fully powered. The selection of different circuit parameters to achieve different results will be apparent to those skilled in the art.

The circuit of FIG. 2 can be further modified by providing suitable circuitry (not shown) for generating a slow ramp signal at 522 that decreases in value, with the fast ramp signal at 502 also decreasing in value. This would achieve a gradual deenergization of the load 12 so that the load turns off in a gradual manner. Suitable circuitry to accomplish this function will be apparent to those skilled in the art.

The control voltage $V_c$ of the circuit of FIGS. 2, 7 and 8 is depicted in FIG. 2 as having a voltage of 0 volts for the off condition of the circuit and a voltage of 10 volts for the on condition of the circuit. Typically, however, the off state of the circuit may be assured where the control voltage varies from zero to about 1.0 volts, and the on condition of the circuit may, be assured where the control voltage varies from about 3.5 to 10 volts. The control voltage should be limited to about 10 volts to prevent circuit malfunction.

The foregoing describes a phase-controlled power switching circuit in which the amount of AC power supplied to an electrical load can be varied in a predetermined manner, or may be varied in response to real time control. Accordingly, surge conditions at the initial powering of an electrical device may be effectively eliminated, or other powering functions may be accomplished. For example, an electrical load may be powered at a level that varies as a function of a real time condition. The circuit incorporates analog components to achieve its function, and thus avoids the complexities and cost of using a microprocessor. Moreover, the circuit may be readily and inexpensively modified to achieve different powering functions.

Although the present invention has been described in connection with a plurality of preferred embodiments thereof, many other variations and modifications will now become apparent to those skilled in the art. It is preferred, therefore, that the present invention be limited not by the specific disclosure herein, but only the appended claims.

What is claimed is:

1. A power switching circuit for applying alternating current power to an electrical load; the alternating current power being characterized as having a voltage waveform with zero crossings at half cycles, said power switching circuit comprising:

a gatable switching means for connecting an alternating current power source to an electrical load and having the property of being turned off by voltage commutation;

means for generating a first signal commencing at an initial value at a zero voltage crossing and changing towards a final value;

reset means for resetting said first signal to said initial value, said resetting occurring no later than one of the half-cycles after said first signal is at said initial value;

means for generating a second signal that is changeable in value at least between said initial and final values of said first signal;

comparator means responsive to said first and second signals for detecting the occurrence of said first and second signals having their difference change in polarity to a predetermined polarity; and gate drive means responsive to said comparator means for gating said switching means into conduction at each respective instant when said first and second signals have their difference change in polarity to said predetermined polarity.

2. The power switching circuit of claim 1, wherein said reset means includes a zero voltage detector, said zero voltage detector having voltage sensing terminals connected across said switching means, and wherein said reset means is effective to produce a unique output during the condition of zero or a relatively small voltage across said switching means.

3. The power switching circuit of claim 2, wherein said zero voltage detector comprises a rectifying diode bridge having a pair of alternating current terminals connected across said switching means.

4. The power switching circuit of claim 1, wherein said first signal generating means comprises a capacitor, a voltage-limiting circuit connected across said capacitor, and a resistor connected across said capacitor and providing a discharge path for said capacitor.

5. The power switching circuit of claim 4, wherein said second signal generating means is effective for generating a signal that rises in value so as to intersect said first signal earlier and earlier in each successive half-cycle of the alternating current power.

6. The power switching circuit of claim 5, wherein said second signal generating means includes a capacitor and a constant current source connected to said capacitor to charge said capacitor.

7. The power switching circuit of claim 6, wherein said constant current source includes a resistor serially connected to said capacitor and means to generate a constant voltage across said resistor.

8. The power switching circuit of claim 7, wherein said resistor of said constant current source includes a variable resistance portion, whereby changing of the resistance of said variable portion results in different times for attaining full powering of the load.

9. The power switching circuit of claim 1, wherein said second signal generating means includes a node on which said second signal is present, a resistor connected to said node, and a variable current source connected to said node to vary the current through said resistor and hence the voltage across said resistor, whereby the selection of the current level in said variable current source determines the value of said second signal.

10. The power switching circuit of claim 9, wherein said variable current source comprises a second resistor serially connected to said first-mentioned resistor and means to generate a controllable voltage across said second resistor.

11. The power switching circuit of claim 10, wherein said means to generate a controllable voltage includes a third resistor and a further variable current source coupled to said third resistor in such manner as to substantially determine the voltage across said third resistor, said third resistor being coupled across said second resistor in such manner as to determine the voltage across said second resistor in response to the voltage across said third resistor 12. The power switching circuit of claim 1, wherein said second signal generating means includes a node on which said second signal exists;

a first resistor with one end connected to said node and the other end being at a reference potential;

a second resistor serially coupled to said node; and a pair of lead means respectively connected across said first and second resistors for impressing a control voltage with respect to said reference potential across said first and second resistors, whereby said second signal voltage on said node is proportional to said control voltage and varying of said control voltage results in proportionate varying of said second signal.

13. The power switching circuit of claim 12, wherein said second signal generating means includes a non-linear device connected in serial relationship with said first and second resistors and between said pair of lead means, said non-linear device being conductive only when a voltage of predetermined level is impressed across said device, whereby said second signal remains at the reference potential until said control voltage exceeds a threshold level and further increases in said control voltage proportionately increases said second signal.

14. The power switching circuit of claim 13, wherein said non-linear device comprises a Zener diode.

15. The power switching circuit of claim 1, wherein said switching means comprises a pair of antiparallel thrysistors.

16. In a power switching circuit of the type including a gatable switching means for connecting an alternating current power source to an electrical load, the switching means having the property of being turned off by voltage commutation, and the power source having the property of including a voltage waveform with zero crossings at half cycles, the improvement comprising:

means for generating a first signal commencing at an initial value at a zero voltage crossing and changing towards a final value;

reset means for resetting said first signal to said initial value, said resetting occurring no later than one of the half-cycles after said first signal is at said initial value;

means for generating a second signal that is changeable in value at least between said initial and final values of said first signal; and comparator means responsive to said first and second signals for detecting the occurrence of said signals having their difference change in polarity to a predetermined polarity and producing an output signal adapted to be transmitted to the switching means for gating on said switching means.

17. The power switching circuit of claim 16, wherein said reset means includes a zero voltage detector, said zero voltage detector having voltage sensing terminals connected across said switching means, and wherein said reset means is effective to produce a unique output during the condition of zero or a relatively small voltage across said switching means.

18. The power switching circuit of claim 17, wherein said zero voltage detector comprises a rectifying diode bridge having a pair of alternating current terminals connected across said switching means.

19. The power switching circuit of claim 16, wherein said first signal generating means comprises a capacitor, a voltage-limiting circuit connected across said capacitor, and a resistor connected across said capacitor and providing a discharge path for said capacitor.

20. The power switching circuit of claim 19, wherein said second signal generating means is effective for generating a signal that rises in value so as to intersect said first signal earlier and earlier in each successive half-cycle of the alternating current power.

21. The power switching circuit of claim 20, wherein said second signal generating means includes a capacitor and a current source connected to said capacitor to charge said capacitor.

22. The power switching circuit of claim 21, wherein said current source includes a resistor serially connected to said capacitor and means to generate a constant voltage across said resistor.

23. The power switching circuit of claim 22, wherein said resistor of said current source includes a variable resistance portion, whereby changing of the resistance of said variable portion results in different times for attaining full powering of the load.

24. The power switching circuit of claim 23, wherein said current source is a constant current source.

25. The power switching circuit of claim 16, wherein said second signal generating means includes a node on which said second signal is present, a resistor connected to said node, and a variable current source connected to said node to vary the current through said resistor and hence the voltage across said resistor, whereby the selection of the current level in said variable current source determines the value of said second signal.

26. The power switching circuit of claim 25, wherein said variable current source comprises a second resistor serially connected to said first-mentioned resistor and means to generate a controllable voltage across said second resistor.

27. The power switching circuit of claim 26, wherein said means to generate a controllable voltage includes a third resistor and a further variable current source coupled to said third resistor in such manner as to substantially determine the voltage said third resistor, said third resistor being coupled across said second resistor in such manner as to determine the voltage across said second resistor in response to the voltage across said third resistor.

28. The power switching circuit of claim 16, wherein said second signal generating means includes:
    a node on which said second signal exists;
    a first resistor with one end connected to said node and the other end being at a reference potential;
    a second resistor serially coupled to said node; and
    a pair of lead means respectively connected across said first and second resistors for impressing a control voltage with respect to said reference potential across said first and second resistors, whereby said second signal voltage on said node is proportional to said control voltage and varying of said control voltage results in proportionate varying of said second signal.

29. The power switching circuit of claim 28, wherein said second signal generating means includes a non-linear device connected in serial relationship with said first and second resistors and between said pair of lead means, said non-linear device being conductive only when a voltage of predetermined level is impressed across said device, whereby said second signal remains at the reference potential until said control voltage exceeds a threshold level and further increases in said control voltage proportionately increases said second signal.

30. The power switching circuit of claim 29, wherein said non-linear device comprises a Zener diode.

31. The power switching circuit of claim 1, wherein:
    said reset means comprises means to generate a unique output during the condition of zero or a relatively small voltage across said switching means; and
    said reset means resets said first signal to said initial value in response to said unique output.

32. The power switching circuit of claim 16, wherein:
    said reset means comprises means to generate a unique output during the condition of zero or a relatively small voltage across said switching means; and
    said reset means resets said first signal to said initial value in response to said unique output.

* * * * *